United States Patent
Hui et al.

(10) Patent No.: US 8,294,124 B2
(45) Date of Patent: Oct. 23, 2012

(54) SCANNING METHOD AND SYSTEM USING 2-D ION IMPLANTER

(75) Inventors: Keung Hui, Hsinchu (TW); Chun-Lin Chang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 171 days.

(21) Appl. No.: 12/688,086

(22) Filed: Jan. 15, 2010

(65) Prior Publication Data
US 2011/0174991 A1   Jul. 21, 2011

(51) Int. Cl.
G21K 5/08 (2006.01)
G21K 5/10 (2006.01)
G21K 5/04 (2006.01)
H01L 21/68 (2006.01)

(52) U.S. Cl. ............ 250/492.21; 250/491.1; 250/492.1; 250/492.2

(58) Field of Classification Search ............... 250/492.2, 250/492.21, 492.22, 492.1, 491.1
See application file for complete search history.

(56) References Cited

U.S. PATENT DOCUMENTS

| | | | | |
|---|---|---|---|---|
| 6,953,942 B1* | 10/2005 | Graf et al. | ............... | 250/492.21 |
| 7,141,809 B2* | 11/2006 | Vanderpot et al. | ........ | 250/492.21 |
| 7,785,060 B2* | 8/2010 | Relleen et al. | ............ | 250/492.21 |
| 2006/0113489 A1* | 6/2006 | Ray et al. | ................ | 250/492.21 |
| 2008/0067434 A1* | 3/2008 | Walther et al. | ........... | 250/492.21 |

* cited by examiner

Primary Examiner — Robert Kim
Assistant Examiner — Wyatt Stoffa
(74) Attorney, Agent, or Firm — Duane Morris LLP

(57) ABSTRACT

An ion implanter system has a movable wafer support for holding a semiconductor wafer and a beam source that generates a beam for implanting ions in the semiconductor wafer while the wafer is moving. A plurality of path segments are identified, through which the wafer support is to move to expose the semiconductor wafer to the ion beam. A first position and a second position are identified for each respective one of the plurality of path segments, such that, when the wafer is in each first position and each second position, a perimeter of the beam projected in a plane of the wafer is tangent to a perimeter of the wafer. The ion implanter is configured to automatically move the wafer along each of the plurality of path segments, starting at the respective first position on each respective path segment and stopping at the respective second position on the same segment, so as to expose the wafer to the beam for implanting ions in the wafer.

7 Claims, 17 Drawing Sheets

SCANNING METHOD AND SYSTEM USING 2-D ION IMPLANTER

FIELD OF THE INVENTION

The present disclosure relates to ion implanter apparatus and methods suitable for processing semiconductor substrates.

BACKGROUND

Ion implantation is a common process during semiconductor fabrication. For example, ions of boron, arsenic, phosphorous, antimony, aluminum and gallium may be implanted in silicon, germanium or other type IV semiconductor material to change the number of negative or positive charge carriers.

A typical conventional ion implanter device has a beam sized so as to expose an entire surface of a wafer simultaneously, such as a 150 mm wafer. In order to reduce product costs, semiconductor foundries have moved towards using larger wafers. For example, technology for fabricating integrated circuits on 450 mm wafers is actively being developed. As wafer size increases, it becomes more difficult to provide an ion beam of uniform intensity and sufficiently large diameter to expose an entire wafer surface simultaneously.

Another type of ion implanter, such as the "iPulsar" system sold by Advanced Ion Beam Technologies, Inc. of San Jose, Calif., has a beam that is smaller than the larger sized wafers. The system has a wafer manipulator 100 capable of moving the wafer past the beam to expose the surface sequentially.

FIGS. 1 and 2 are schematic diagrams of the wafer of the iPulsar type system.

The system 100 has a fixed-location beam 110. The wafer 130 is mounted at the end of a scanner arm 120. The scanner arm 120 has two types of motion. As shown in FIG. 1, the scanner arm 120 pivots about a pivot axis located at a point $p_x$, $p_y$, with a pivot angle theta ($\theta$). The wafer 130 and pivot arm 120 are also shown in phantom at different positions to represent examples of different angles $\theta$ through which the scanner arm 120 pivots.

FIG. 2 shows that the wafer manipulator 100 has a means (shown by actuator 140) for raising and lowering the pivot axis $p_x$, $p_y$ of the scanner arm 120. When the pivot axis $p_x$, $p_y$ is raised up, the lower portion of the wafer 130 (closer to the pivot axis) is exposed to the beam 110. When the pivot axis $p_x$, $p_y$ is lowered, the upper portion of the wafer 130 (farther from the pivot axis) is exposed to the beam 110.

One of ordinary skill in the art can appreciate that the scanner type ion implanter can be used for implanting a variety of wafer sizes, including wafers larger than the beam. Because the wafer size is not limited by the beam size, a relatively smaller beam having good uniformity can be used.

Improved methods of ion implantation using a scanner type implanter are desired.

SUMMARY OF THE INVENTION

In some embodiments, a method is provided for operating an ion implanter system having a movable wafer support for holding a semiconductor wafer and a beam source that generates a beam for implanting ions in the wafer while the wafer is moving. The semiconductor wafer is moved along each of a plurality of first segments so as to implant ions in the wafer. Each first segment extends across the beam. Each first segment begins with a leading edge of the wafer at a first tangent point entering the beam and ends with a trailing edge of the wafer at a second tangent point exiting the beam. The semiconductor wafer is moved directly along at least one second segment connecting the second tangent point of a first one of the plurality of first segments and the first tangent point of a second one of the plurality of segments.

In some embodiments a method is provided for operating an ion implanter system having a movable wafer support for holding a semiconductor wafer and a beam source that generates a beam for implanting ions in the semiconductor wafer while the wafer is moving. A plurality of path segments are identified, through which the wafer support is to move to expose the semiconductor wafer to the ion beam. A first position and a second position are identified for each respective one of the plurality of path segments, such that, when the wafer is in each first position and each second position, a perimeter of the beam projected in a plane of the wafer is tangent to a perimeter of the wafer. The ion implanter is configured to automatically move the wafer along each of the plurality of path segments, starting at the respective first position on each respective path segment and stopping at the respective second position on the same segment, so as to expose the wafer to the beam for implanting ions in the wafer.

In some embodiments, an ion implanter system comprises a movable wafer support for holding a semiconductor wafer, a beam source that generates a beam for implanting ions in the wafer while the wafer is moving, and a controller for controlling the wafer support, so as to: move the semiconductor wafer along each of a plurality of first segments so as to implant ions in the wafer, each first segment extending across the beam, each first segment beginning with a leading edge of the wafer at a first tangent point entering the beam and ending with a trailing edge of the wafer at a second tangent point exiting the beam; and move the semiconductor wafer directly along at least one second segment connecting the second tangent point of a first one of the plurality of first segments and the first tangent point of a second one of the plurality of segments.

DETAILED DESCRIPTION

Figure 1:
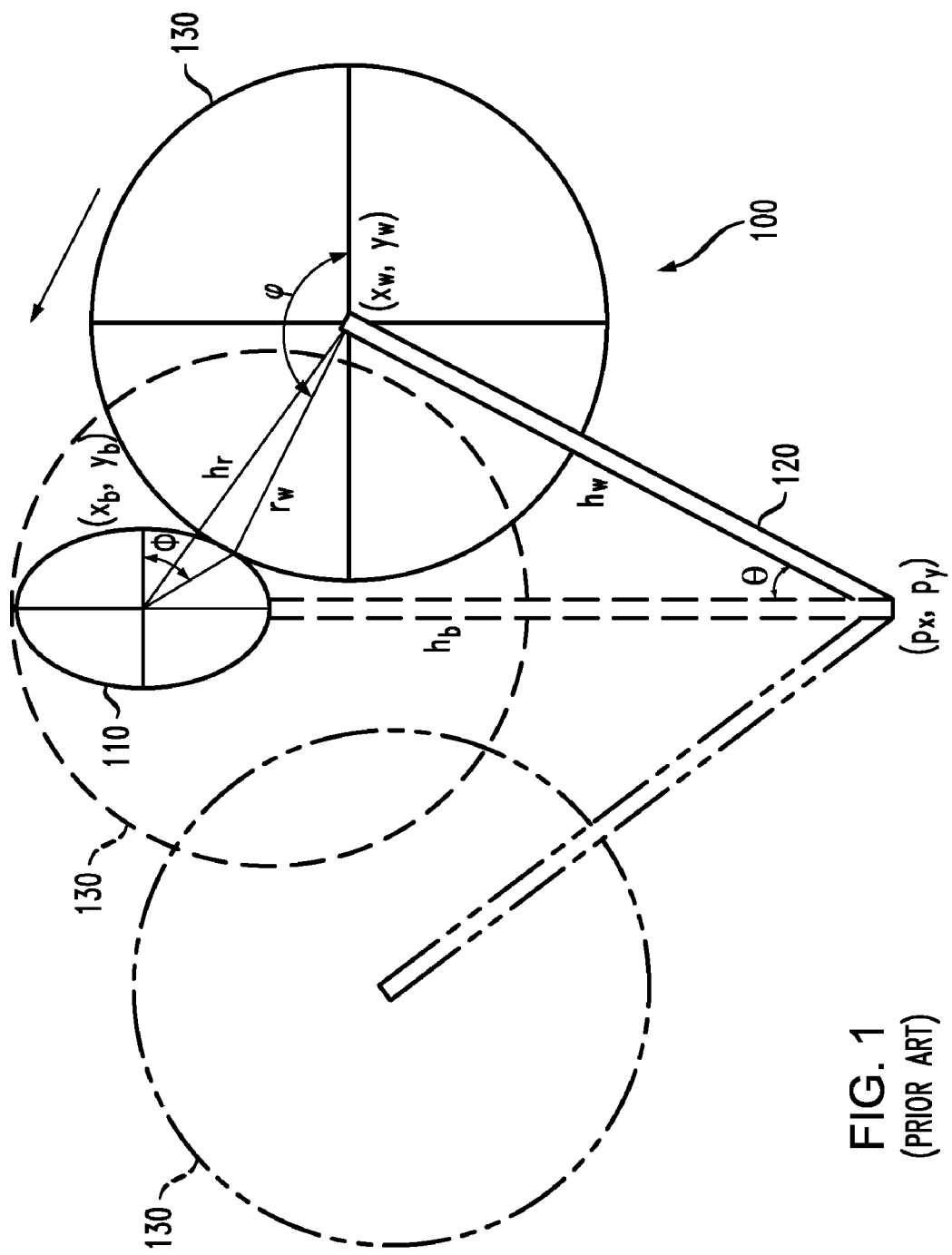
FIG. 1 shows pivoting motion of the arm of a conventional scanning type ion implanter.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
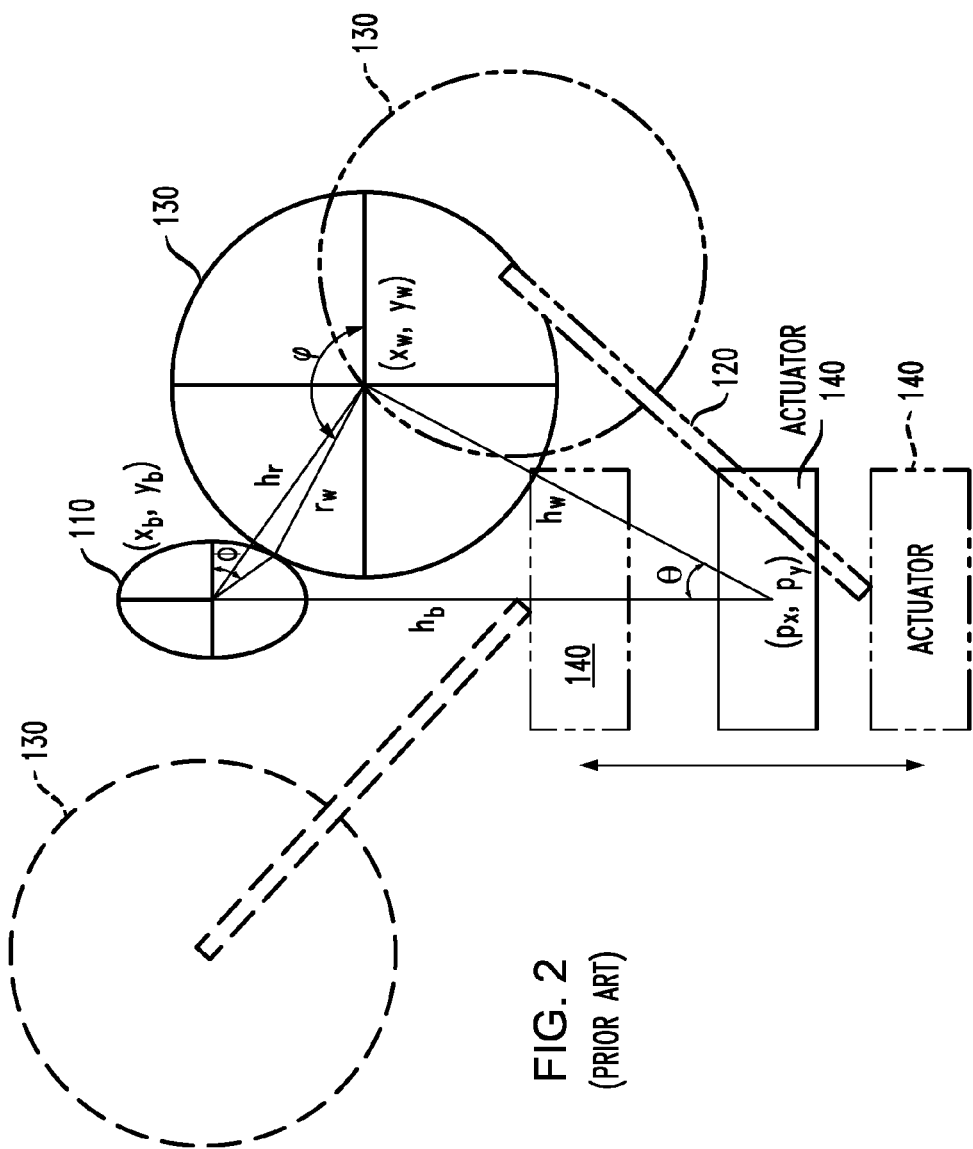
FIG. 2 shows the vertical motion of the scanner arm pivot axis of FIG. 1.
Figure 3:
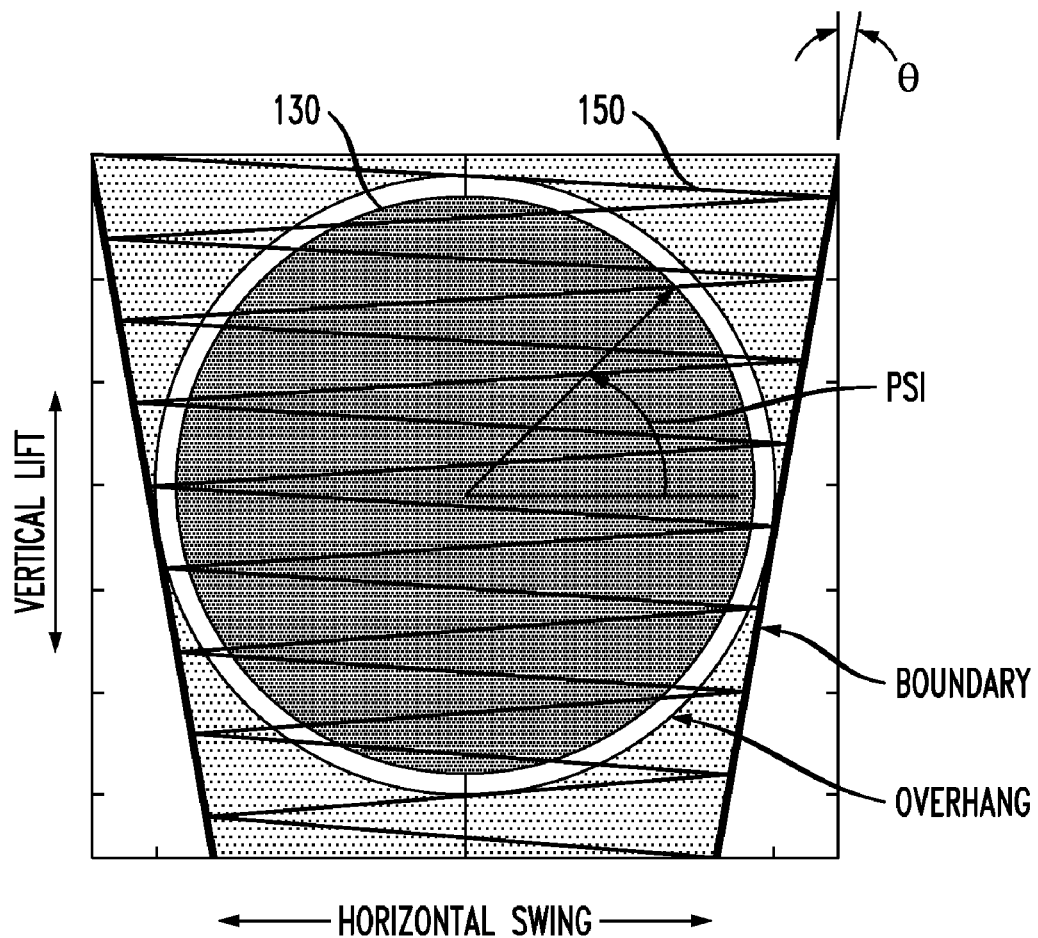
FIG. 3 shows a projection of a trace of the center of the beam of FIG. 1 on the wafer, as the wafer moves across the beam (in the coordinate system of the wafer).

A scanning type ion implanter of the type discussed above employs a relatively complex method for controlling the scanning pattern of the wafer 130 across the ion beam 110. The operator inputs a plurality of entry/exit angles, which define the angles θ and psi (φ), as shown in FIGS. 1-3. For a given scanner arm pivot axis vertical position, the first angle θ is the rotation angle of the scanner arm 120 at the maximum rotation of the arm. The angle θ may be selected as shown in FIG. 3 to be large enough for the wafer to pass all the way across the beam at all of the vertical scanner arm pivot axis positions to be used during the implant process. A plurality of values for the angle psi (φ) are input, each corresponding to a different position at which the circumference of the wafer 130 crosses the beam 110. FIG. 3 shows a trace 150 of the projection of the center of the beam 110 on the wafer as the wafer sweeps past the beam and the scanner arm 120 moves vertically, with the pivot axis raised progressively higher (or lowered progressively). (FIG. 3 is shown in the coordinate system of the wafer.)

The present inventors have found that the method of operating the implanter shown in FIG. 3 does not make the most efficient use of the ion implanter resource, increases process time, and decreases tool throughput. A method is described below to operate the tool in a more efficient manner, reducing implant time and increasing throughput. Although an example is shown in the figures in which the beam has an elliptical cross section, the method can be used with any beam shape, including for example, circular, rectangular and square beams. Although the example has a scanner arm which moves in a circular arc about a pivot axis at a point $p_x,p_y$, the method may also be used for an implanter having a scanner arm that moves along straight line segments, or in more complex paths (e.g., along elliptical paths).

Figure 4:
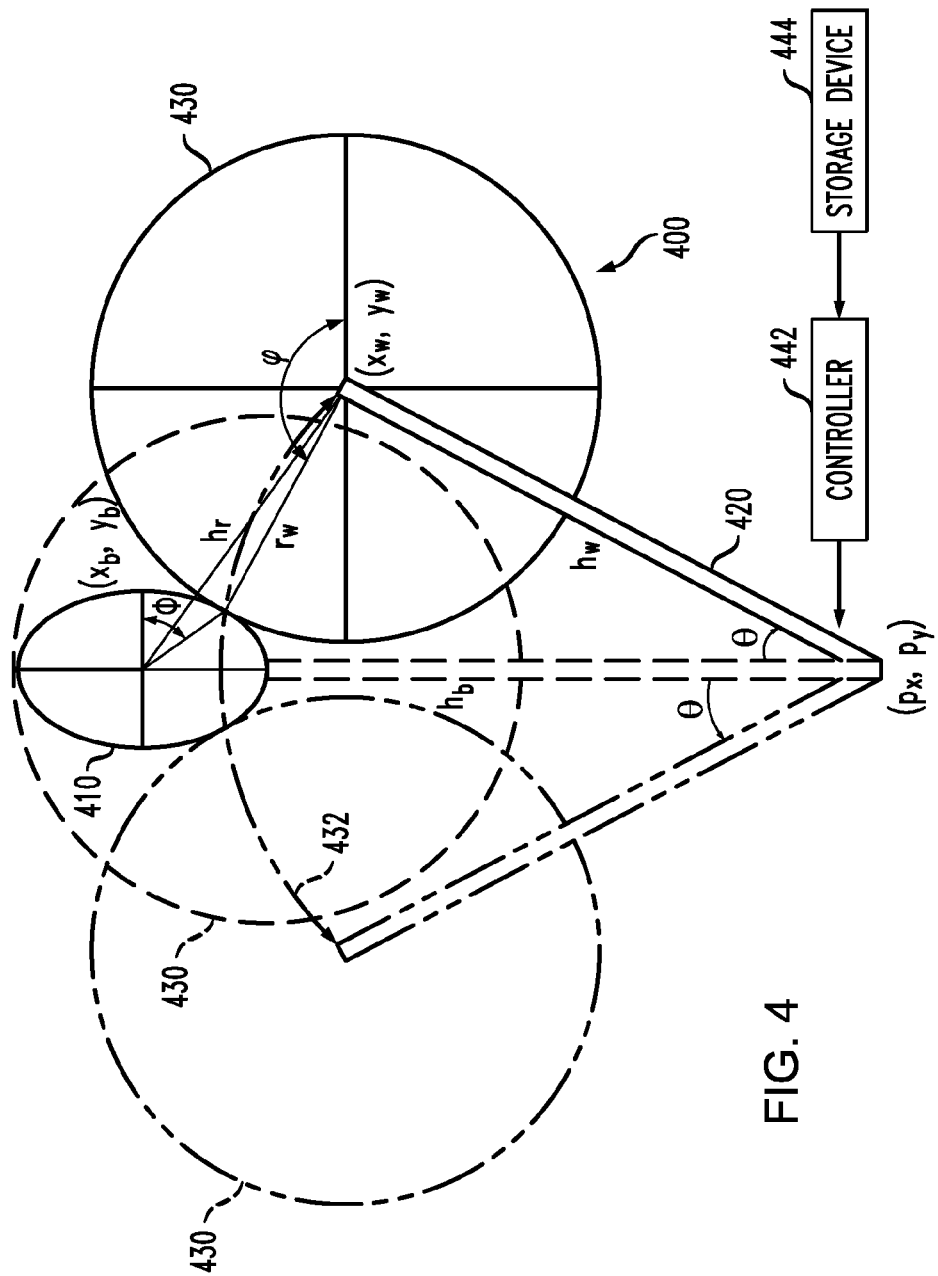
FIG. 4 shows an embodiment of a method of scanning a wafer across the beam.

Referring now to FIG. 4, the tangential direction motion of the wafer manipulator 400 using the exemplary method is shown. The wafer manipulator 400 may be the wafer handler of a scanning type implanter such as the "iPulsar" system sold by Advanced Ion Beam Technologies, Inc. of San Jose, Calif., or of another scanning type implanter by any manufacturer. In FIG. 4, the wafer 430 and scanner arm 420 are shown in three positions, with the scanner arm pivot axis in a constant vertical position at point $p_x,p_y$. In FIG. 4, the angle θ is limited, so that the wafer 430 does not move outward past the angle at which the wafer shares a tangent point with the boundary of the beam 410. In the example of FIG. 4, the scanner arm pivots in a circular motion, so that the center of the wafer moves through an arc subtending an angle of 2θ.

Figure 5A:
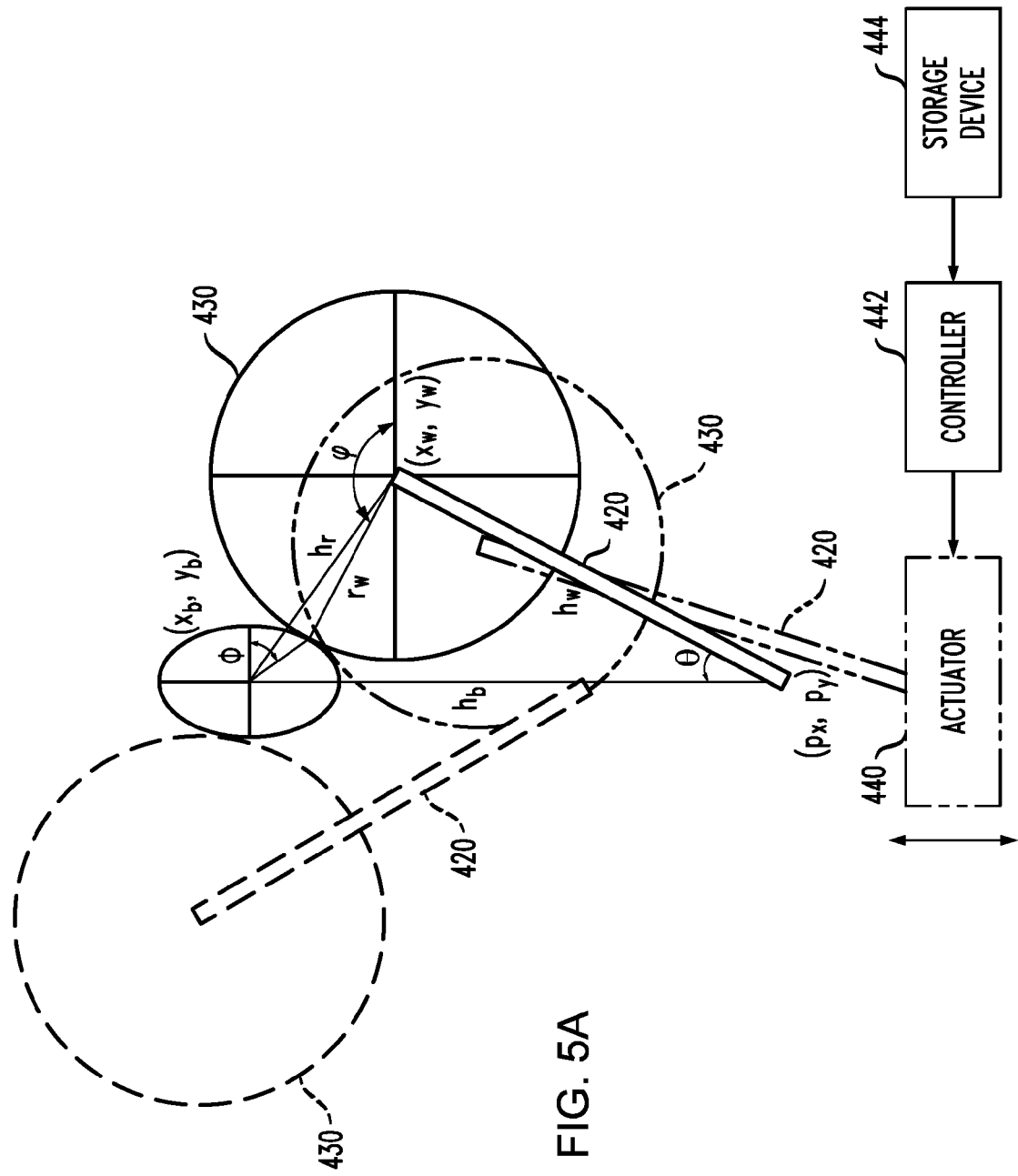
FIG. 5A shows various vertical positions of the scanner arm pivot axis, with corresponding wafer positions.

FIG. 5A shows the wafer 430 at the maximum extent of its angular travel, at three different vertical displacements of the pivot axis $p_x,p_y$ of the scanner arm 420. Regardless of the vertical position $p_x,p_y$ of the scanner arm pivot axis 420, the wafer's tangential direction motion does not extend outward beyond an angle at which the trailing edge of the wafer just reaches the boundary of the beam. As shown in FIG. 5A, the maximum angle θ, through which arm 420 sweeps, changes for different vertical positions of the scanner arm pivot axis. As the actuator 440 moves the scanner arm pivot axis up and down, the maximum angle θ changes. In general, the first angle θ is smaller when the second angle psi (φ) is near π/2 or 3π/2, and the first angle θ is greatest when the second angle psi (φ) is near π or 2π.

Figure 5B:
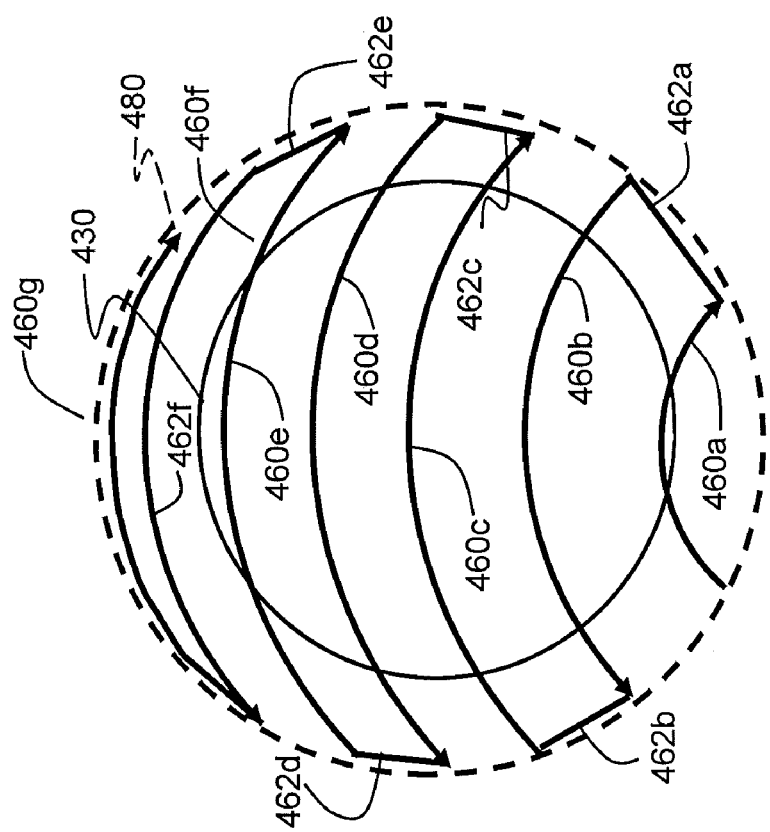
FIG. 5B shows a method for changing vertical position each time the beam reaches it's maximum angular displacement.

FIG. 5B schematically shows one variation, in which the vertical position $p_x,p_y$ of the scanner arm pivot axis 420 changes when the arm reaches its maximum angle θ with each swing, and a respectively different angle θ is used for each pass by the wafer 430 across the beam 410. FIG. 5B shows a serpentine trace of the projection of the center $x_b,y_b$ of the beam 410 on the wafer 430. (FIG. 5B is shown in the coordinate system of the wafer.) In FIG. 5B, the scanner arm pivot axis $p_x,p_y$ moves from top to bottom, so that the trace of the beam axis across the wafer moves from bottom to top. For simplicity, only seven first segments (arcs 460a-460g) are shown schematically. A respective one of the second segments 462a-462f connects the end point of a previous arc 460a-460g with the beginning point of the next succeeding first segment 460a-460g. When the scanner arm 420 is at its lowest position (to expose the top portion of the wafer 430), the angle θ is smaller than when the scanner arm 420 is at an intermediate position to expose the center of the wafer 430. Similarly, when the scanner arm 420 is at its highest position (to expose the bottom portion of the wafer 430), the angle θ is smaller than when the scanner arm 420 is at an intermediate position to expose the center of the wafer.

As the number of first segments (i.e., sweeps of the wafer past the beam) increases, the envelope 480 enclosing the serpentine trace approaches an ellipse or circle. (For a non-circular beam shape, the envelope 480 deviates from being a circle. For wafer size>>beam dimension, the envelope 480 approaches a circle). Unlike the trapezoidal envelope of FIG. 3, the wafer does not extend beyond a point where the wafer is tangent to the beam. In other words, the wafer does not continue beyond the boundary of the beam, so that at least a portion of the wafer is always being exposed.

Figure 6:
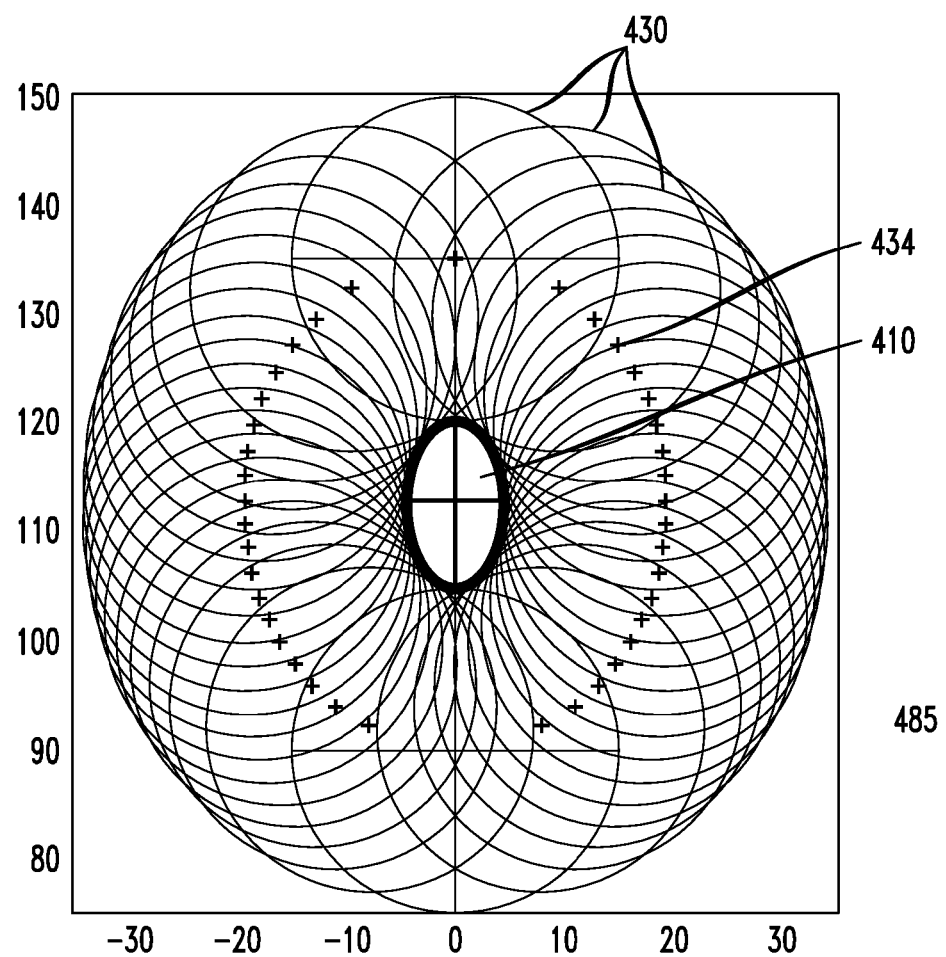
FIG. 6 shows a locus of wafer positions relative to the stationary beam (in the coordinate system of the beam).

FIG. 6 is a diagram schematically showing various positions of the wafer 430 using a serpentine pattern, as described with reference to FIG. 5B. FIG. 6 is shown in the coordinate system of the beam 410, so the beam is shown as fixed. In FIG.

6, each of the crosses 434 represents the center of the wafer, when the wafer manipulator 400 is set at a respectively different vertical position $p_x,p_y$ of the pivot axis of the wafer scanner arm 420. In FIG. 6, wafer positions corresponding to approximately 20 different vertical positions of the wafer scanner pivot axis $p_x,p_y$ are shown. In other words, the wafer swings back and forth in the serpentine pattern, with 19 vertical movements of the scanner arm pivot axis occurring when the pivot arm is at the left or right extreme position of its motion. Although the quantity of positions in FIG. 6 is greater than that shown in FIG. 5B, the two figures represent the same motion qualitatively. The different appearance of the two diagrams is primarily because the two diagrams are drawn in two different coordinate systems from each other. In FIG. 6, the crosses do not represent a circular motion of the wafer around the beam—rather, the wafer moves back and forth in a serpentine motion within a nearly-elliptical or nearly-circular envelope 485.

Figure 5D:
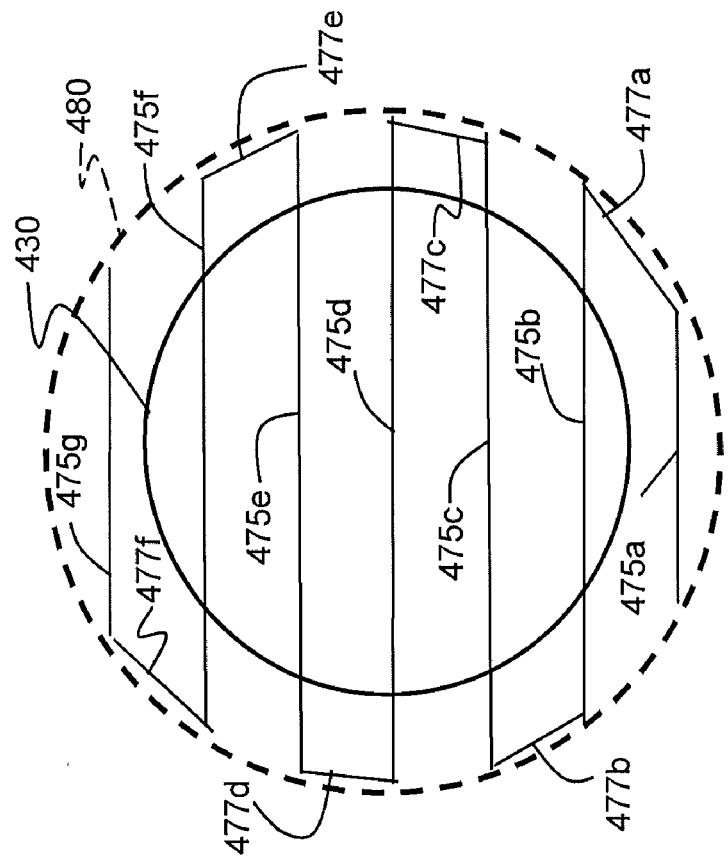
FIG. 5D shows a method for changing vertical position with each pass, for a system that moves the wafer with a horizontal linear actuator.
Figure 5C:
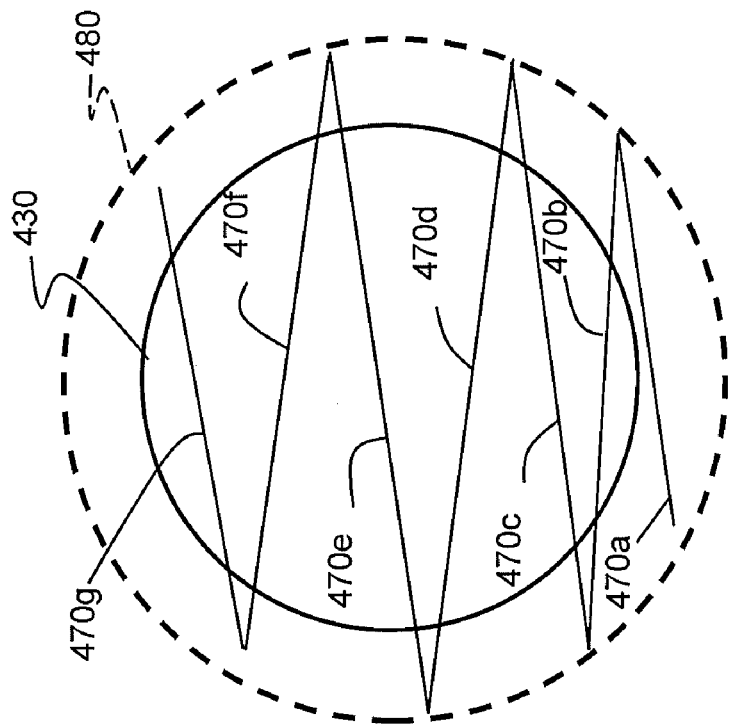
FIG. 5C shows a method for changing vertical position continuously.

FIG. 5C shows another variation, in which the vertical position of the pivot axis arm 420 is continuously adjusted, so that the wafer 430 scans back and forth across the beam 410 in a zig-zag pattern. By continuously adjusting the vertical position of the pivot axis arm 420, the whole wafer can be exposed without including separate segments primarily used to move the scanning arm pivot axis.

To achieve the pattern shown in FIG. 5C, an ion implanter system is used having a movable wafer support 420 for holding a semiconductor wafer 430 and a beam source 410 that generates a beam for implanting ions in the semiconductor wafer while the wafer is moving A plurality of path segments are identified through which the wafer support 420 is to move to expose the semiconductor wafer 430 to the ion beam 410. These segments are represented by line segments 470a-470g, which form a trace of the projection of the center of the beam 410 on the wafer 430, in the coordinate system of the wafer. A first position and a second position are identified for each respective one of the plurality of path segments, such that, when the wafer is in each first position and each second position, a perimeter of the beam projected in a plane of the wafer is tangent to a perimeter of the wafer. In FIG. 5C, the first position and second position represent the endpoints of each of the segments 470a-470g.

The ion implanter is configured to automatically move the wafer 430 along each of the plurality of path segments 470a-470g, starting at the respective first position on each respective path segment and stopping at the respective second position on the same segment, so as to expose the wafer to the beam for implanting ions in the wafer.

As shown in FIG. 5C, the trace of the center of the beam 410 forms a zig-zag pattern within an envelope, such that the wafer is exposed to the beam at least at a tangent point throughout the motion of the wafer. The wafer does not move outward in a direction away from the beam center beyond the point at which the wafer is tangent to the beam.

Figure 11:
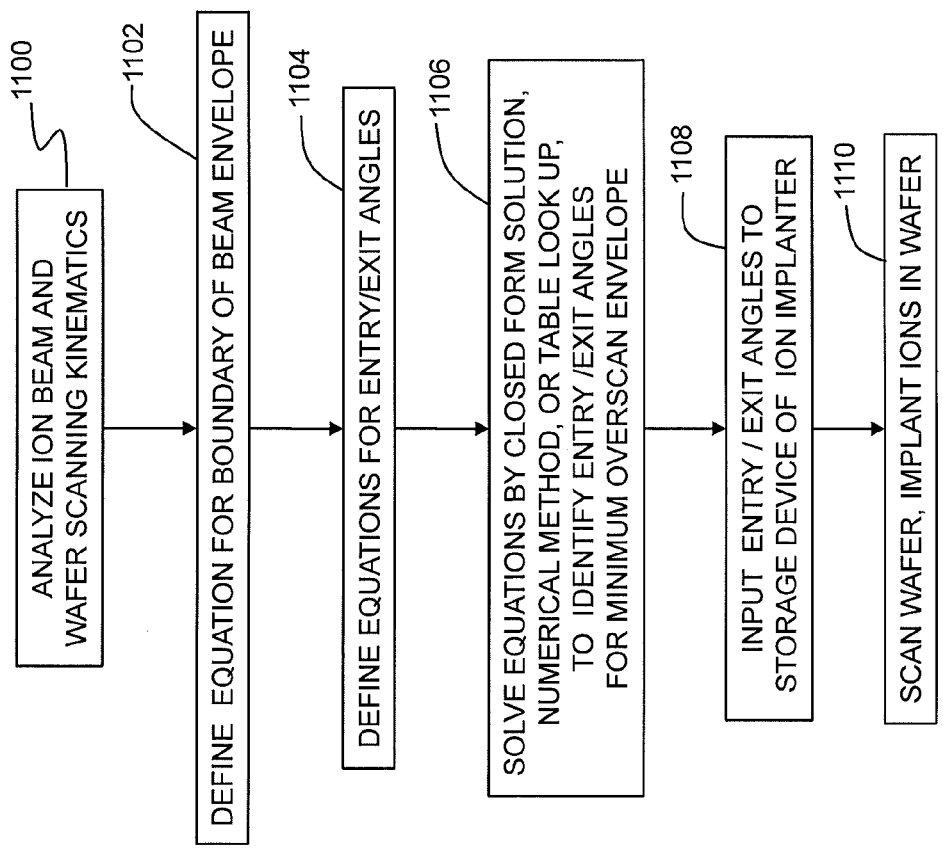
FIG. 11 is a flow chart of an exemplary method.

FIG. 11 is a flow chart of an exemplary method for operating an ion implanter system having a movable wafer support 420 for holding a semiconductor wafer 430, and a beam source 410 that generates a beam for implanting ions in the wafer 430 while the wafer is moving.

Figure 7:
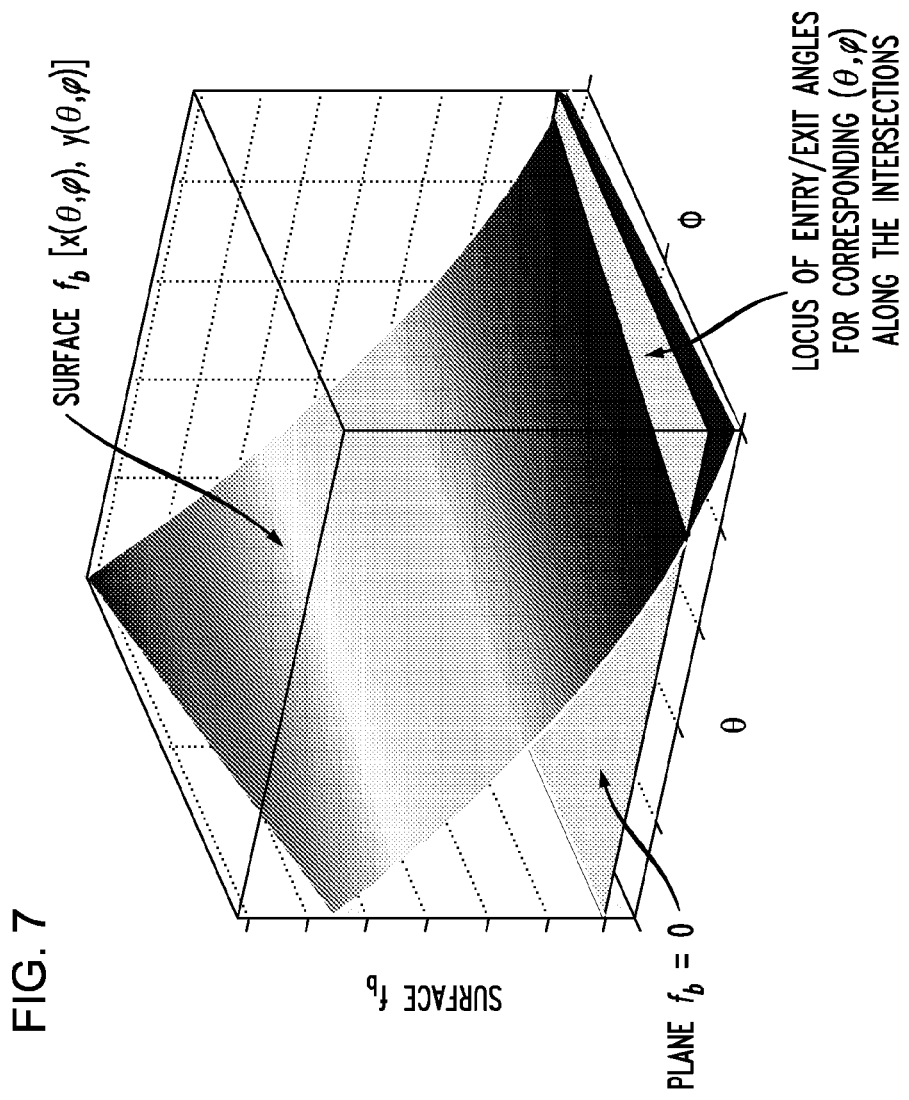
FIG. 7 is a schematic diagram of the space ($\theta$, $\phi$, $f_b$) defined by scanner pivot angle ($\theta$), wafer tangent angle ($\phi$), and beam intensity ($f_b$).

At step 1100, the ion beam shape and beam intensity and wafer scanning kinematics are analyzed. The shape of the beam boundary (where the beam intensity $f_b$ just reaches zero) is determined, for example by a test on a stationary substrate or detector device. FIG. 7 shows an example of a beam intensity profile in the three-dimensional $(\theta, \phi, f_b)$ space. The region where $f_b>0$ is on the interior of the beam. Of particular interest in step 1100 is the locus of points in the two dimensional $(\theta, \phi)$ plane, where $f_b$=zero. This is the boundary of the beam 410.

Referring again to FIG. 11, at step 1102, a mathematical description of the boundary of the beam envelope is determined. In some cases, such as a circular or elliptical beam, an equation defining the boundary of the beam (where $f_b$=zero) is readily determined. For a more general or irregular beam boundary shape that is not easily expressed as an equation, the beam boundary can be defined by a set of points where $f_b$=zero, and the derivative of the beam boundary can be determined by numerical methods.

The wafer scanning kinematics are machine dependent. For example, in the above mentioned iPulsar system, the wafer center $x_w,y_w$ is at a fixed distance $h_w$ from the scanner arm pivot axis $p_x,p_y$, where $h_w$ is the length of the scanner arm 420. The pivot axis $p_x,p_y$ can be moved vertically to expose different parts of the wafer to the beam 410 during respectively different passes of the wafer. The wafer 430 moves in a circular arc about the beam 410. The angle subtended during any given complete pass is $2\theta$, where $\theta$ is the angle between a first line connecting the pivot axis $p_x,p_y$ and the center of the beam (located at $x_b,y_b$) and a second line connecting the pivot axis $p_x,p_y$ to the center of the wafer $x_w,y_w$ when the wafer shares a single tangent point with the beam boundary $f_b$. In other types of machines, the kinematics may be different. For example, if a scanning type implanter (not shown) provides horizontal and vertical linear actuators (instead of a pivot arm), then the motion of the wafer across the beam can be parallel horizontal line segments, instead of arcs.

At step 1104, a mathematical representation for the entry/exit angles $(\theta, \phi)$ is developed. For simple beam shapes and wafer motions, the entry/exit angles can be represented by equations. Generally a system of three equations is developed.

$$f_b(x, y \mid x_b, y_b) = 0 \quad (1)$$

$$f_b(\varphi) = \frac{df_b(\varphi)}{d\varphi} = 0 \quad (2)$$

$$\begin{bmatrix} x \\ y \end{bmatrix} = \begin{bmatrix} p_x \\ p_y \end{bmatrix} + h_w \cdot \begin{bmatrix} \sin(\theta) \\ \cos(\theta) \end{bmatrix} + r_w \cdot \begin{bmatrix} \cos(\varphi) \\ \sin(\varphi) \end{bmatrix} \quad (3)$$

Equation (1) expresses the boundary shape of the beam, where the value of the beam intensity function equals zero. In the example, $f_b$ is most easily expressed in a Cartesian (x,y) coordinate system.

Equation (2) expresses the condition that the derivative of the boundary shape with respect to $\phi$ is zero. Since the angle $\phi$ is measured in the coordinate system of the wafer, this equation provides the minimum values of the boundary $f_b$ measured from the center of the wafer. That is, the point on the boundary $f_b$ that is closed to the wafer center.

Equation (3) expresses in Cartesian coordinates the location of a point on the circumference of the wafer having the entry/exit angles $(\theta, \phi)$.

Thus, combining equations (1), (2) and (3) provides the location of a point on the boundary of the beam, that is also on the circumference of the wafer, where the wafer is tangent to the beam at a single point. These relationships are subject to the constraints, $\theta \in [0, \theta_{max}]$, $\{\phi_1, \phi_2\} \in [0, 2\pi]$. $\theta_{max}$ is confined by the actual setup of the wafer manipulator dimensions. However, a smaller value of $\theta$ may be used throughout the implant. For example, for a circular or elliptical beam, the maximum value of θ at which the wafer 430 can be tangent to any part of the beam 410 is the value when φ=π (when the wafer is directly to the right of, and tangent to, the beam). It is thus desirable to maintain θ less than or equal to this value.

At step 1106, the equations or mathematical representation of the entry/exit angles are solved, either by a closed form solution, a numerical method (e.g., using an iterative method), or by table lookup (optionally, with interpolation).

One of ordinary skill can readily determine whether the given equations corresponding to a particular beam shape can easily be solved to provide a closed form solution, based on the complexity of the equations for that shape, using calculus and algebra.

In some systems, the equations are more easily solved by a numerical method, where the values of $f_b$ are calculated, the values of $f_b$ at intermediate points may be estimated using interpolation, and the value of $df_b/d\phi$ is estimated by $\Delta f_b/\Delta \phi$. The equations can be solved using a method such as Newton's method or a half-interval method or the like. These methods are iterative, and the user can repeat the iteration as often as appropriate to achieve a desired level of accuracy or resolution.

In other systems (e.g., where the beam may have an irregular boundary shape), it may be desirable to use an indirect searching algorithm. For example, one can directly evaluate $f_b[x(\theta,\phi), y(\theta,\phi)]$ for each combination of $\theta \in [0, \theta_{max}]$ or $\theta \in [-\theta_{max}, 0]$ and $\phi \in \Phi$. (Where $\Phi$ is an angle defining the tangent point between the beam 410 and the wafer 430 in the coordinate system of the beam 410; and a finite number of angles is assumed for θ and φ, such as integer numbers of degrees, or integer number of grads). Any of the grid-points such that $f_b[x(\theta,\phi), y(\theta,\phi)]=0$ or $f_b[x(\theta,\phi), y(\theta,\phi)] \rightarrow 0$ give the respective entry/exit angles for the corresponding (θ, φ).

Figure 8:
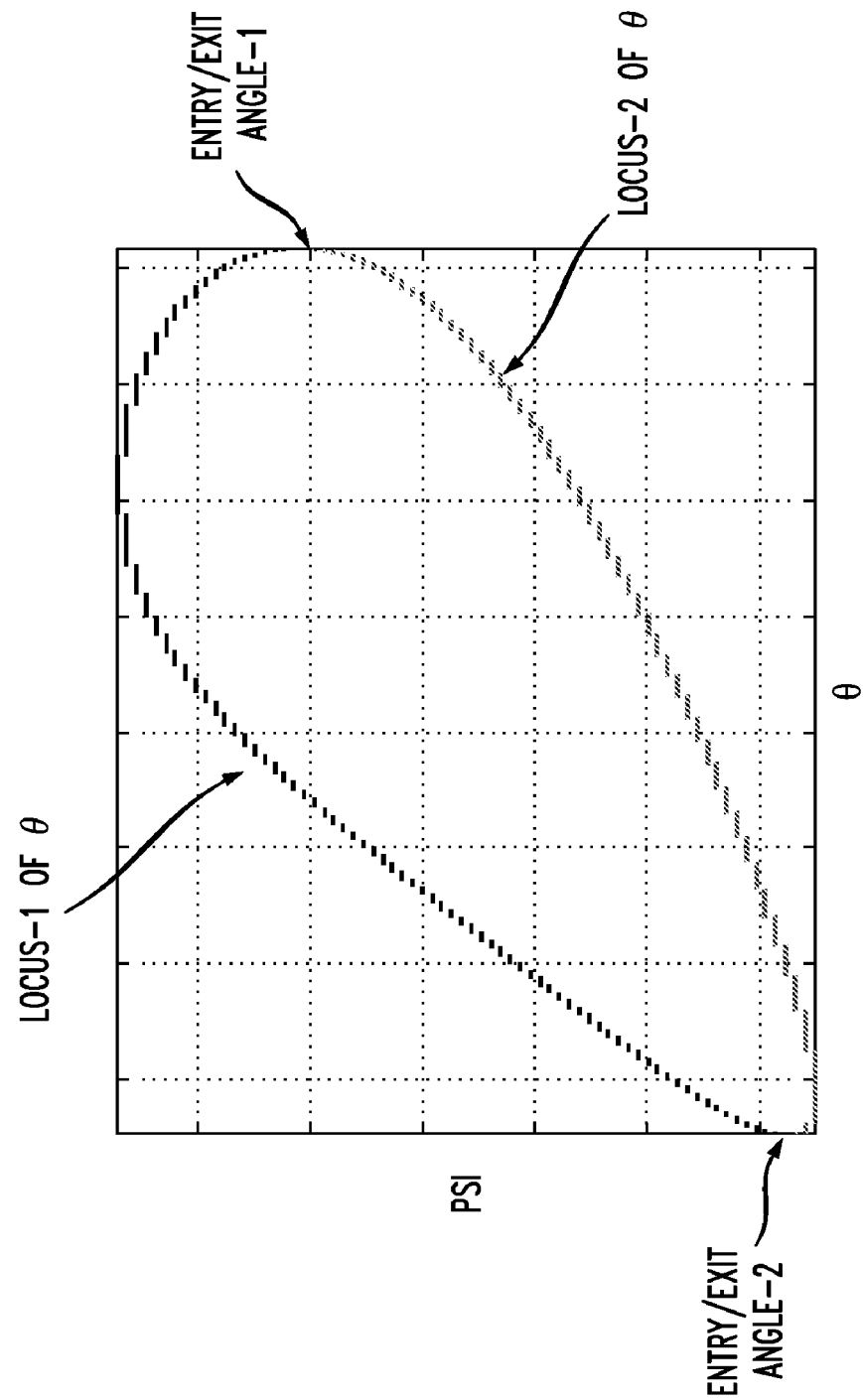
FIG. 8 is a diagram of a locus of points at which the wafer circumference intersects the beam boundary for a single vertical position of the scanner arm pivot axis.

FIG. 8 shows an example of the locus of points on the boundary of the beam 410, diagrammed as combinations of angles on the (θ,φ) plane, for a single vertical location $p_x, p_y$ of the wafer scanner pivot axis. The particular combinations of interest are the points where $df_b/d\phi=0$, that is, where the tangent to the locus is vertical. There are two such points shown in FIG. 8, labeled entry/exit angle-1 and entry/exit angle-2. To select the proper solution from these two angles, a review of the different conditions at these two points is instructive.

Figure 10:
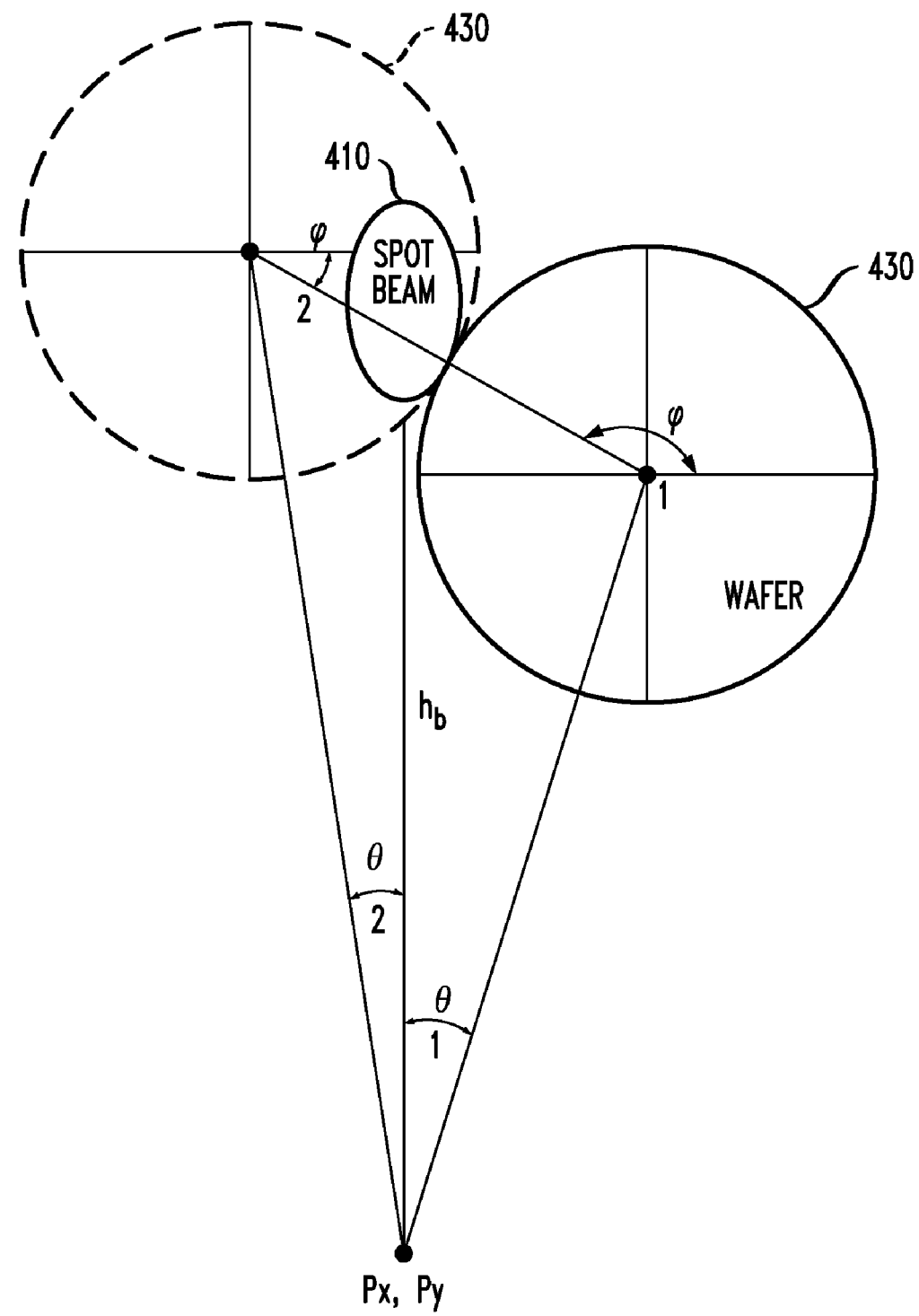
FIG. 10 shows disambiguation between two wafer positions that share a single common tangent point with the beam boundary.

FIG. 10 is a diagram showing the wafer in both of the positions identified by the angle combinations where $df_b/d\phi=0$. When arm 420 positions the wafer 430 at the angle $\theta_1$, the wafer is at a tangent point just entering/exiting the beam. When the entire beam 410 is on the wafer 430 (as shown in phantom) the arm 420 is at the angle $\theta_2$. At the angle $\theta_2$, the wafer is just beginning to exit the beam, but points on the wafer circumference have not been exposed, except right at the tangent point. Therefore, for complete, uniform exposure, the larger angle $\theta_1$ should be used.

Referring again to FIG. 8, the larger angle $\theta_1$ is shown by "entry/exit angle-1. Thus, the combination of (θ,φ) at this position should be included in the entry/exit angle combinations input to the ion implanter.

Although FIG. 8 is a graphical representation of the locus of points on the boundary of the beam, mapped on the (θ,φ) plane, the values of (θ,φ) can be calculated automatically by a programmed processor for a given set of points on the boundary, and these coordinates can be stored in a table in a computer readable storage medium. The values of $df_b/d\phi$ can be estimated by the processor as $\Delta f_b/\Delta \phi$, and stored in a table in the computer readable storage medium. Then the processor can find the points for which $df_b/d\phi$ are zero or nearest to zero. If the closest value of $df_b/d\phi$ to zero is greater than a threshold value, then additional points can be calculated between the points that are closest to zero, to find a better estimate of the point at which the wafer is tangent to the beam. This can be repeated multiple times, until a desired level of accuracy or resolution is obtained. In various embodiments, the processor for performing these computations may be internal to, or external from, the ion implanter apparatus.

The processor may be a separate computer system (not shown), or the above described functions may be included in the controller 442 that controls the ion implanter. Similarly, the storage medium maybe a local device connected to a separate computer, or may be the storage medium 444 connected to the controller 442 of the implanter.

Figure 9:
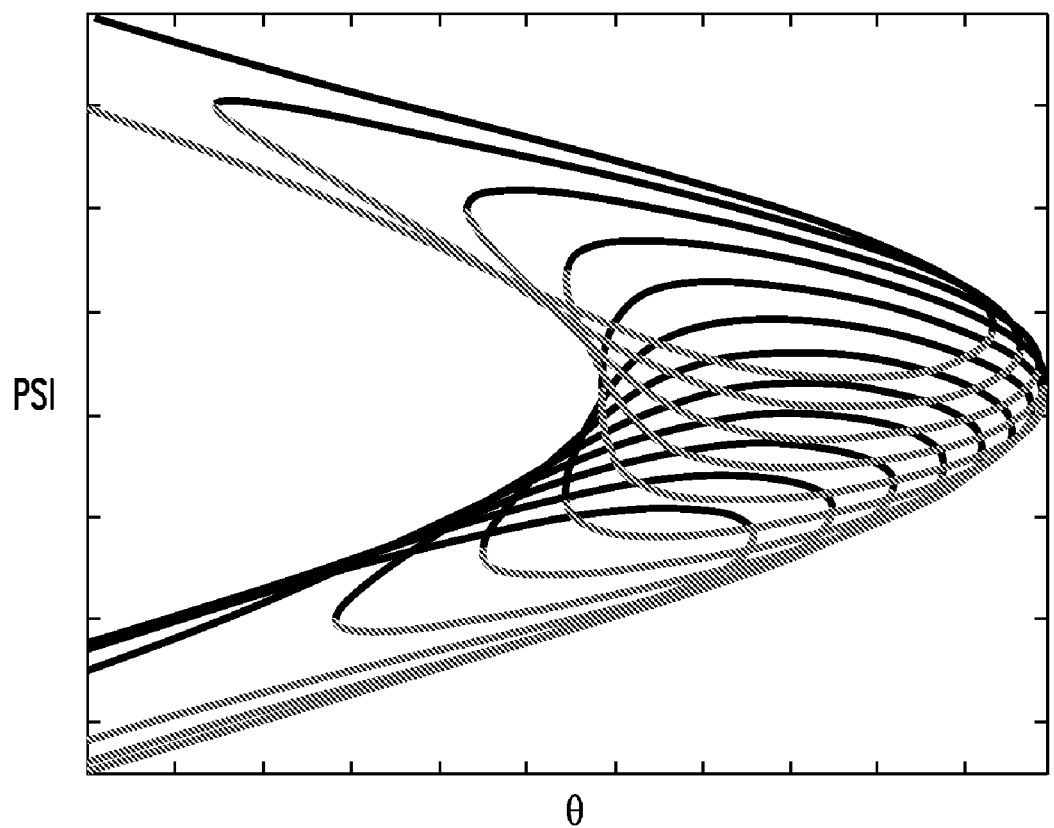
FIG. 9 is a diagram showing a plurality of curves, each corresponding to the locus of intersection points (between wafer circumference and beam boundary) for a respectively different vertical position of the scanner arm pivot axis.

FIG. 9 shows a plurality of locus curves, each corresponding to a respectively different vertical position of the scanner arm pivot axis. By generating these curves, the respective entry/exit angles (θ,φ) are determined for each vertical position of the scanner arm.

Referring again to FIG. 11, at step 1108, the calculated entry/exit angles (θ,φ) for all of the wafer scanning passes are input to a storage device of the ion implanter. This storage device may be internal to, or external from, the implanter.

At step 1110, the wafer is scanned using the input entry/exit angles described above, implanting ions in the wafer.

Figure 12:
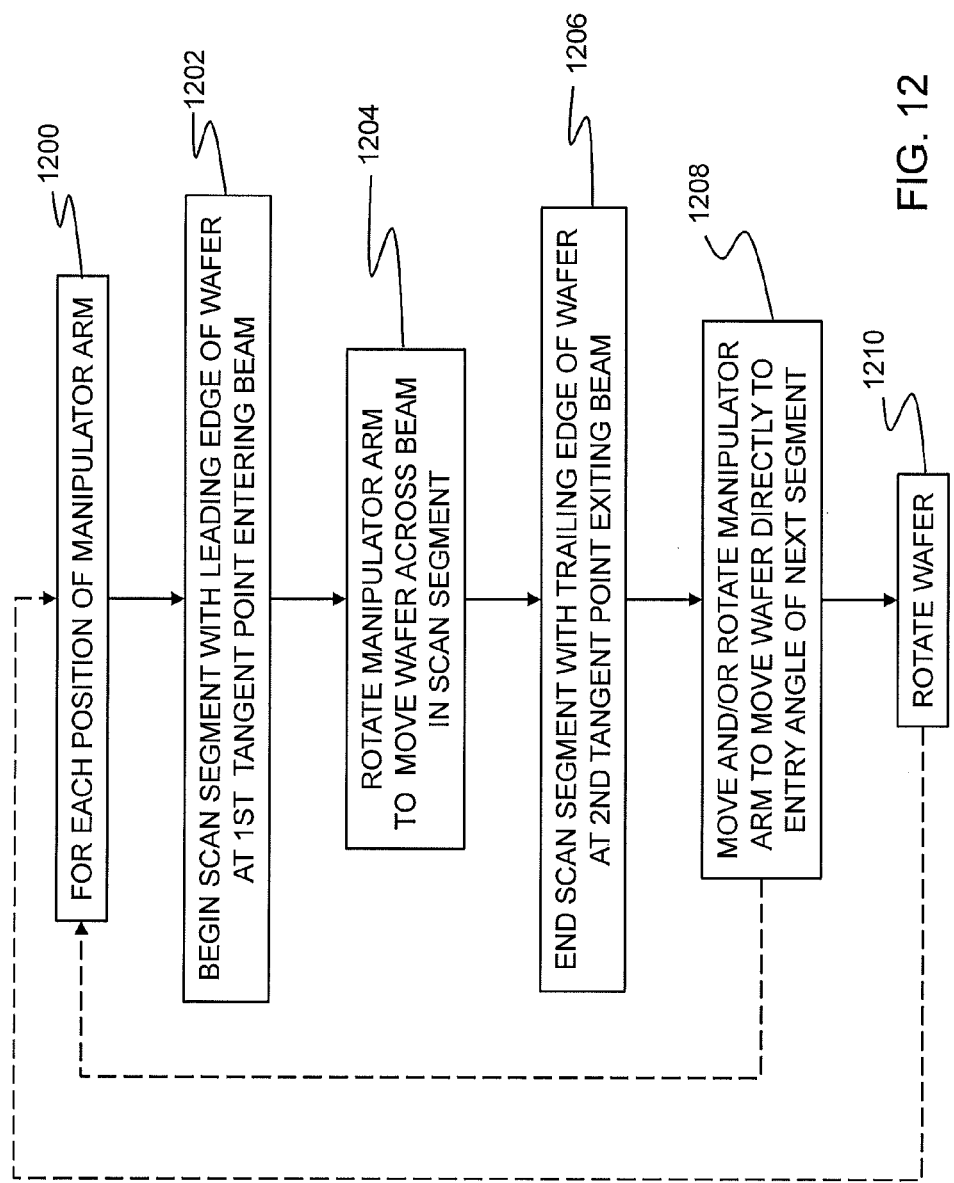
FIG. 12 is a flow chart of an embodiment of the scanning step 1110 of FIG. 11.

FIG. 12 is a flow chart of an embodiment of the implantation step 1110.

At step 1200, a loop including steps 1202 to 1210 is performed for each vertical position $p_x, p_y$ of the scanner pivot axis to be used. For example, the axis may be moved to 20-30 positions, and the loop may be executed for each of these positions.

At step 1202, a scanning step is begun with the leading edge of the wafer at the first tangent point entering the beam. (The term "leading edge" is not limited to either left or right, but indicates the edge facing the direction of motion at any given time).

At step 1204, the pivoting of the arm 420 moves the semiconductor wafer 430 along one of a plurality of first segments so as to implant ions in the wafer.

At step 1206, a first segment ends with the trailing edge of the wafer at a second tangent point exiting the beam. (The term "trailing edge" is not limited to either left or right, but indicates the edge facing in a direction opposite the direction of motion at any given time).

For example, FIG. 4 shows a first segment 432 beginning with the wafer shown by a solid line on the right of the figure, moving leftwards with its leading (left) edge tangent to the beam 410, and ending with the wafer shown by a dash-dotted line on the left of the figure, moving leftwards with its trailing (right) edge tangent to the beam 410.

In the example described above, the arm 420 pivots about an axis at $p_x, p_y$. As a result, the first segments are circular arcs 432 (FIG. 4) having a radius $h_w$. The first scanning segments are also shown by the segments 460a-460g in FIG. 5B.

In some embodiments, as shown in FIG. 5B, the wafer 430 moves back and forth across the beam 410, stopping when the trailing edge of the circumference of the wafer reaches the boundary of the beam, without continuing outward beyond the boundary of the beam. Regardless of the vertical position of the scanning arm pivot axis, the wafer does not move outward beyond the edge of the beam.

In other embodiments, as shown in FIG. 5C, the scanning arm moves up or down continuously while the wafer sweeps past the beam 410, as shown in FIG. 5C, instead of just moving the scanning arm 420 during the second segments while the wafer is at the maximum angle. Although determining the entry/exit angles (θ,φ) for this type of zig-zag motion is conceptually the same as for the motion of FIG. 5B or 5D, it is more computationally intensive, because the scanner arm pivot axis position must be factored into the computations throughout.

In other types of implanter equipment as shown in FIG. 5D, the wafer may be moved during the first scanning segments by a horizontal linear actuator, in which case the first segments would be horizontal lines instead of circular arcs. Such horizontal segments would look like the schematic drawings of the representative segments 475a-475g. The second segments 477a-477f can be substantially the same as the corresponding second segments 462a-462f in FIG. 5B.

Referring again to FIG. 12, at step 1208, the semiconductor wafer is moved directly along at least one second segment (e.g., segments 462a-462f, FIG. 5B) connecting the second tangent point of a first one of the plurality of first segments and the first tangent point of a second one of the plurality of segments. The scanner arm pivot axis $p_x,p_y$ moves vertically during the second segment, between the first segments. Depending on the direction of the second segment, the arm may also pivot while the wafer moves along the second segment. For example, when $\phi$ is close to zero or $\pi$, the second segment may be a straight vertical segment, and the arm does not pivot while moving the wafer through the second segment. When $\phi$ is close to $\pi/2$ or $3\pi/2$, the scanner arm 420 may pivot inwards towards a reduced value of $\theta$ during the second segments.

At step 1210, when the scanner arm pivot axis 420 has moved through its entire range to expose the entire wafer 430, the wafer can optionally be rotated and exposed again. For example in some embodiments, the wafer 430 is rotated 90 degrees, and the wafer is again scanned, this time moving the pivot arm vertically in the opposite direction between successive first scanning segments. In other embodiments, after the wafer is completely exposed a second time, the wafer is again rotated 90 degrees, and the scanning is repeated a third (and optionally a fourth) time. Thus, the entire exposure can be performed with the wafer rotated at 0, 90, 180 and 270 degrees relative to the scanner arm 420. Repeatedly exposing the wafer 430 to the beam 410, with the wafer in different orientations, compensates for any non-uniformities in the beam. The greater the number of exposures, and the smaller the rotation angle between exposures, the more uniform the implant process will be, at the expense of process time.

Figure 13:
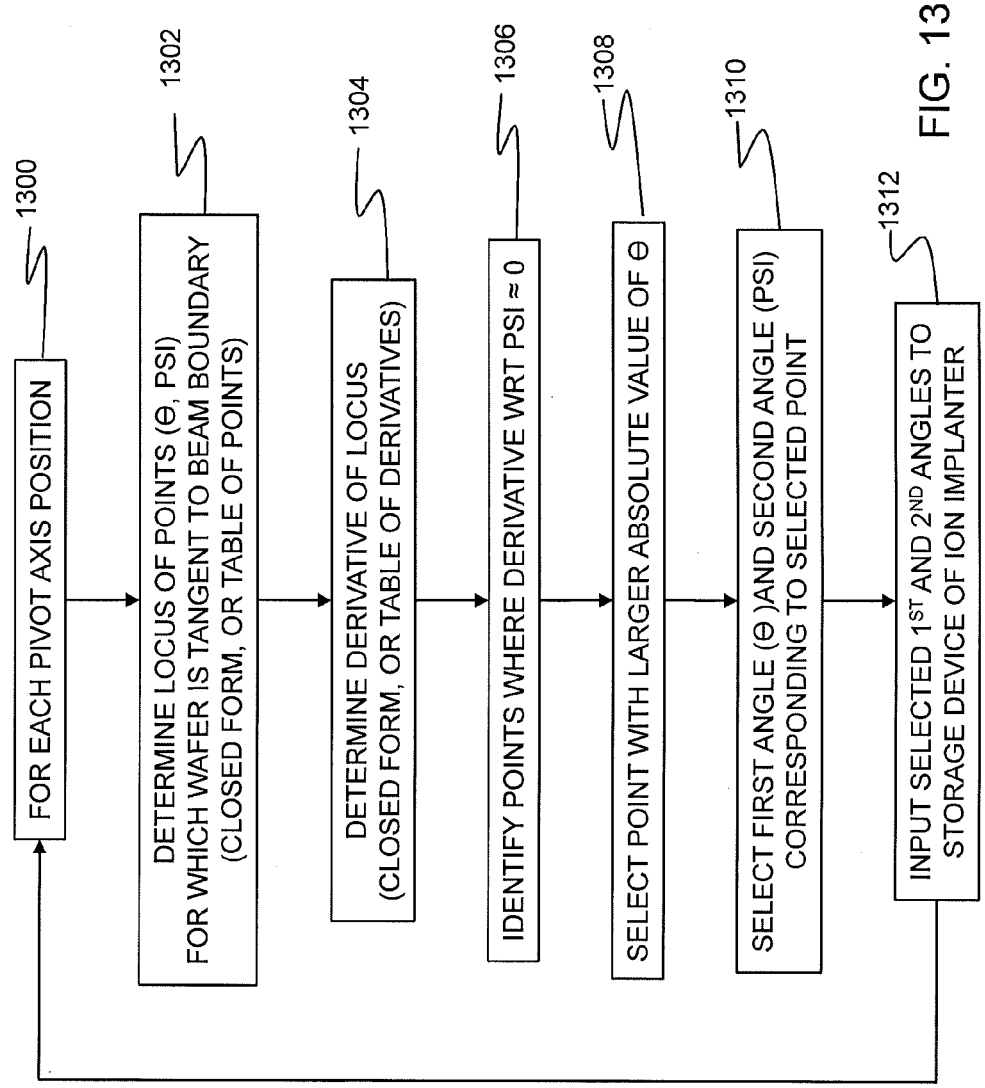
FIG. 13 is a flow chart of an embodiment of the solution step 1106 of FIG. 11.

FIG. 13 is a detailed flow chart of a method for calculating the entry/exit angles $(\theta,\phi)$, as discussed above with respect to step 1106 of FIG. 11. This method may be used regardless of whether a closed form solution is easily found, and regardless of the ease or difficulty of determining the locus of $(\theta,\phi)$ points.

At step 1300, a loop including steps 1302-1310 is repeated for each vertical pivot axis position.

At step 1302, a locus of points on the boundary $f_b$ of the beam are transformed from the Cartesian coordinate system into $(\theta,\phi)$ points in the coordinate system of the wafer scanner arm 420. For example, a point along the beam boundary $f_b$ may be included at each one-degree increment. Any other increment may be selected, to provide a desired level of accuracy. An alternative calculation method is to find the locus of points on the wafer boundary at selected $\phi$ intervals (e.g., one-degree intervals), and calculate the value of $\theta$ corresponding to each value of $\phi$, such that the point lies along the circumference of the wafer and the boundary of the beam.

At step 1304, a derivative $df_b/d\phi$ of the $(\theta,\phi)$ locus curve is determined at each of the points. If a closed form solution is not used, the derivative $df_b/d\phi$ is approximated by $\Delta f_b/\Delta\phi$.

At step 1306, the points where the derivative $df_b/d\phi$ is equal or substantially equal to zero are determined.

At step 1308, if there are more than one point with the derivative $df_b/d\phi$ is equal to zero, then the point with the greater absolute value of $\theta$ is selected.

At step 1310, the first and second entry/exit angles $(\theta,\phi)$ corresponding to the selected point are selected for input to the ion implanter.

At step 1312, the first and second entry/exit angles $(\theta\phi)$ are input to the ion implanter.

Figure 14:
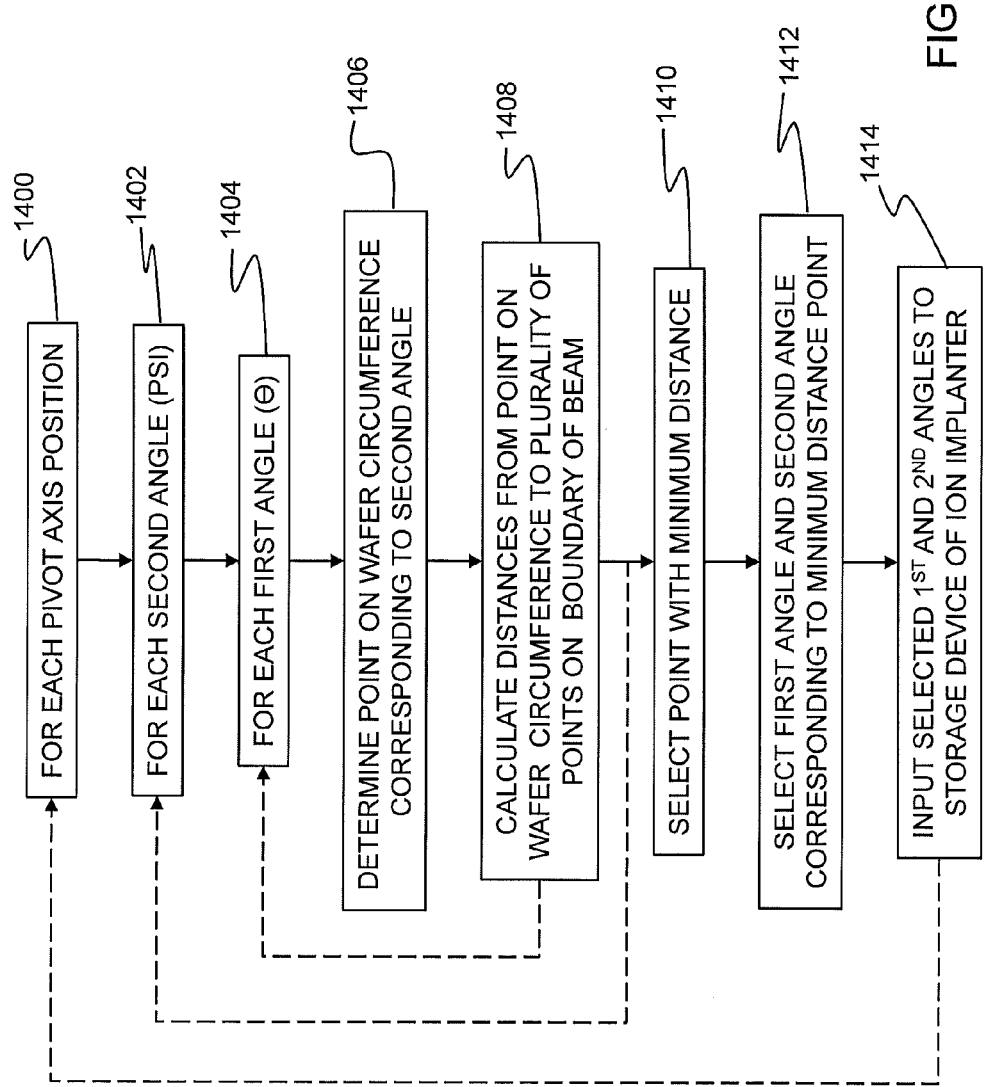
FIG. 14 is a flow chart of another embodiment of the solution step 1106 of FIG. 11.

FIG. 14 is another example of a method for finding the entry/exit angles $(\theta\phi)$.

At step 1400, a loop is performed for each vertical position of pivot axis $p_x,p_y$, including steps 1402-1414.

At step 1402, a loop is performed for each wafer angle $\phi$, including steps 1404-1408.

At step 1404, a loop is performed for each scanner arm angle $\theta$, including steps 1406-1408.

At step 1406, a point on the wafer circumference is determined, corresponding to the second angle $\phi$.

At step 1408, a distance is calculated between the calculated point on the wafer circumference, and a plurality of points on the boundary of the beam. The plurality of points on the boundary may include all previously calculated points on the boundary stored in a table. In some embodiments, the distance from the point on the wafer circumference is computed for every point on the boundary $f_b$ of the beam 410. In some embodiments, distances are calculated for a subset of the points on the boundary $f_b$ of the beam 410. For example, the quadrant of the beam in which the tangent point is located can be determined based on the angle $\phi$. Then the distance may be calculated for a subset of points on the boundary for only one quadrant. (E.g., if $\pi/2 \leq \phi \leq \pi$, then the point on the circumference of the wafer is in the wafer's second quadrant, which shares a tangent point with the fourth quadrant of the beam boundary. Thus, the distance can be computed for points in the fourth quadrant of $f_b$, without computing other distances.)

At step 1410, the point on the boundary of the beam with the minimum distance (among the calculated distances) to the point on the circumference of the wafer is selected. Optionally, if the minimum distance is greater than a convergence threshold distance, additional points on the boundary of the beam can be determined by interpolation between the nearest points to the point on the wafer circumference. Either linear or quadratic interpolation are acceptable for this purpose. If any of the interpolated points on the beam boundary is closer to the point on the circumference of the wafer than the original set of points stored in the table, then the interpolated point having the minimum distance is selected. As an alternative to interpolation, if the boundary $f_b$ can be calculated or estimated by an equation, then the intermediate points are directly calculated from the equation.

At step 1412, the first and second angles $(\theta,\phi)$ are selected, corresponding to the minimum distance point identified at step 1410.

At step 1414, the selected first and second angles $(\theta,\phi)$ are input to the machine readable storage medium of the ion implanter.

Figure 15:
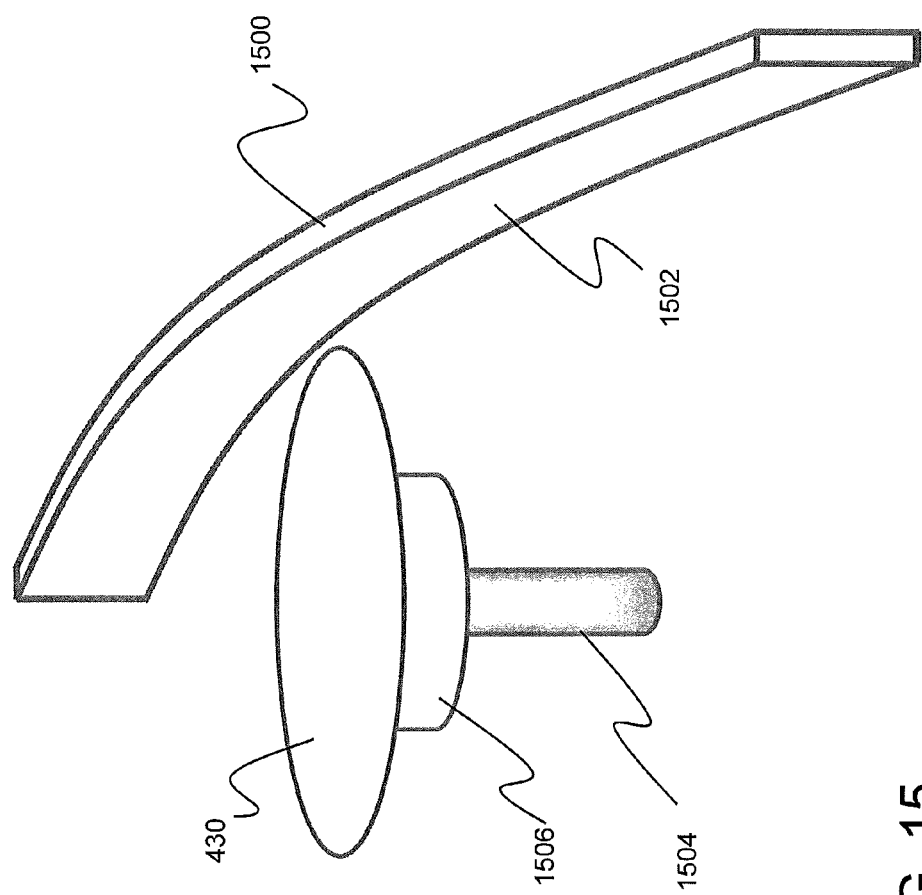
FIG. 15 is a schematic diagram of a guide pin and ring mechanism for reversing direction of a wafer scanner arm.

Although an example is described above, in which the wafer scanner arm entry/exit angles $(\theta,\phi)$ are controlled using software controls, other embodiments employ a hardware control mechanism. FIG. 15 is a schematic diagram of a guide pin and guide ring mechanism for controlling the reversal (or change) of direction of the wafer scanning arm when the maximum angle $\theta$ is reached. In some embodiments, the guide ring 1500 is fixed. The shape of the guide ring is similar to the shape of the envelope 480 (with a small difference to accommodate the non-zero radius of the guide pin 1504). The wafer scanner arm 420 of the wafer manipulator is permitted to swing until the guide pin 1504 of the wafer holding device 1506 contacts the guiding surface 1502 of the guide ring 1500. In some embodiments, the guide-ring 1500 may include a plurality of limit-switches located at positions along the guiding surface 1502. Activation of one of these limit-switches causes transmission of a signal to the controller 442. In other embodiments, the guide pin 1504 acts as a joystick to transmit a signal indicating that contact has been made, and provide an indication of motion direction.

The present invention may be embodied in systems including computer-implemented processes and apparatus for practicing those processes. Some embodiments include one or more elements comprising computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for implementing one or more elements of an embodiment of the invention. Some embodiments include one or more elements embodied in the form of computer program code, whether stored in a storage medium, loaded into and/or executed by a computer, such that, when the computer program code is loaded into and executed by a computer, the computer becomes an element of an apparatus according to an embodiment of the invention. When implemented on a general-purpose processor, the computer program code segments configure the processor to create specific logic circuits. In some embodiments, one or more elements may alternatively be embodied in a digital signal processor formed of application specific integrated circuits for performing one or more steps of a method according to an embodiment of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for operating an ion implanter system having a movable wafer support for holding a semiconductor wafer and a beam source that generates a beam for implanting ions in the wafer while the wafer is moving, the method comprising:
   (a) calculating coordinates defining a plurality of first segments, each first segment extending across the beam, each first segment beginning with a leading edge of the wafer at a first tangent point entering the beam and ending with a trailing edge of the wafer at a second tangent point exiting the beam;
   (b) inputting data of the calculated coordinates identifying the respective first tangent points and second tangent points for each of the plurality of first segments, into the ion implanter system, so as to implant ions in the wafer;
   (c) moving the semiconductor wafer along each of the plurality of first segments after inputting the first and second tangent points; and
   (d) moving the semiconductor wafer directly along at least one second segment connecting the second tangent point of a first one of the plurality of first segments and the first tangent point of a second one of the plurality of segments;

wherein:
   the movable wafer support is configured to move a center of the wafer across the beam in an arc having an arc radius; and a center of the arc is varied among a plurality of pivot axis positions, each of the plurality of first segments corresponding to a respective one of the pivot axis positions;
   the movable wafer support moves the wafer through a respective arc about the pivot axis with the pivot axis alternately located at each one of the pivot axis positions; the ion implanter system is configured to receive the first tangent point specified by:
   a first angle between a first line and a second line, the first line extending from the pivot axis to the center of the beam, the second line extending from the pivot axis to the center of the wafer, and
   a second angle between a third line and a fourth line, the third line being normal to the first line, the fourth line connecting the center of the wafer to a point where the wafer is tangent to the beam, and
   the method further comprises, before step (a): calculating respective values of the first angle and second angle for each of the plurality of first segments corresponding to the plurality of pivot axis positions; and inputting the respective first angle and second angle for each respective first segment into a storage device of the ion implanter system; and
wherein the calculating respective values of the first angle and second angle for each of the plurality of first segments comprises, for one of the pivot axis positions:
   identifying a plurality of values of the second angle, and for each value of the second angle, a corresponding point at the circumference of the wafer; for each value of the second angle, and each of a plurality of values of the first angle, calculating a distance between at least one point on a boundary of the beam and the point at the circumference of the wafer corresponding to that value of the second angle; selecting a combination of the first angle and the second angle having a minimum distance among the calculated distances, as the first angle and second angle to be input corresponding to the one pivot axis position.

2. The method of claim 1, wherein the plurality of first segments are selected so that an entire surface of the wafer is exposed to the beam while moving the semiconductor wafer along the plurality of first segments.

3. The method of claim 2, wherein, during steps (a) and (b), the wafer is not moved away from a center of the beam beyond a point where a circumference of the wafer is tangent to a boundary of the beam.

4. The method of claim 2, further comprising:
   rotating the wafer by a predetermined angle after exposing the entire surface of the wafer; and
   repeating steps (c) and (d).

5. The method of claim 2, wherein at least a part of the circumference of the wafer is exposed to the beam throughout steps (c) and (d).

6. A method for operating an ion implanter system having a movable wafer support having a pivot axis for holding a semiconductor wafer and a beam source that generates a beam for implanting ions in the wafer while the wafer is moving, the method comprising:
   for each of at least two pivot axis positions:
      specifying a first angle between a first line and a second line, the first line extending from the pivot axis to the center of the beam, the second line extending from the pivot axis to the center of the wafer and a second angle between a third line and a fourth line, the third line being normal to the first line, the fourth line connecting the center of the wafer to a point where the wafer is tangent to the beam;

determining a locus of first angle-second angle pairs corresponding to points where a boundary of the beam crosses a circumference of the wafer as the wafer moves along an arc corresponding to that pivot axis position;

identifying at least one first angle-second angle pair in the locus, for which a derivative of the locus with respect to the second angle is zero; and selecting the identified first angle-second angle pair to be input as the first angle and second angle corresponding to the one pivot axis position, moving the semiconductor wafer along each of a plurality of first segments corresponding to respective pivot angle positions, so as to implant ions in the wafer, each first segment extending across the beam, each first segment beginning with a leading edge of the wafer at a first tangent point entering the beam and ending with a trailing edge of the wafer at a second tangent point exiting the beam, wherein the first tangent point for each of the first segments is defined by the selected first angle-second angle pair corresponding to one of the at least two pivot axis positions; and moving the semiconductor wafer directly along at least one second segment connecting the second tangent point of a first one of the plurality of first segments and the first tangent point of a second one of the plurality of segments.

7. The method of claim 6, wherein:

for a given pivot axis position, two different first angle-second angle pairs in the locus are identified as having the derivative of the locus with respect to the second angle equal to zero, and the one of the identified first angle-second angle pairs for which the respective first angle has a greater magnitude is selected to be input as the first angle and second angle corresponding to the one pivot axis position.

* * * * *